United States Patent [19]
Mangelsdorf

[11] Patent Number: 5,387,914
[45] Date of Patent: Feb. 7, 1995

[54] CORRECTION RANGE TECHNIQUE FOR MULTI-RANGE A/D CONVERTER

[75] Inventor: Christopher W. Mangelsdorf, Reading, Mass.

[73] Assignee: Analog Devices, Incorporated, Norwood, Mass.

[21] Appl. No.: 20,556

[22] Filed: Feb. 22, 1993

[51] Int. Cl.$^6$ ............................................. H03M 1/36
[52] U.S. Cl. ................................... 341/156; 341/118
[58] Field of Search ............... 341/118, 120, 156, 158, 341/159

[56] References Cited

U.S. PATENT DOCUMENTS

| | | | |
|---|---|---|---|
| 4,393,368 | 7/1983 | Rasmussen | 341/156 |
| 4,542,370 | 9/1985 | Yamada et al. | 341/156 |
| 4,804,960 | 2/1989 | Fernandes et al. | 341/158 |
| 4,814,767 | 3/1989 | Fernandes et al. | 341/158 |
| 4,894,657 | 1/1990 | Hwang et al. | 341/158 |
| 5,043,732 | 8/1991 | Robertson et al. | 341/156 |
| 5,138,319 | 8/1992 | Tesch | 341/156 |
| 5,151,700 | 9/1992 | Matsuzawa et al. | 341/156 |
| 5,184,130 | 2/1993 | Mangelsdorf | 341/156 |
| 5,194,866 | 3/1993 | Imaizumi et al. | 341/156 |
| 5,210,537 | 5/1993 | Mangelsdorf | 341/156 |
| 5,264,851 | 11/1993 | Yasuda | 341/156 |

Primary Examiner—Howard L. Williams
Attorney, Agent, or Firm—Parmelee Bollinger & Bramblett

[57] ABSTRACT

An analog-to-digital converter (ADC) having three cascaded A/D stages of the "flash" type. In the first stage, the analog signal is compared with a set of threshold reference voltages so as to develop a set of most-significant bits and to produce two analog residue signals: (1) a normal residue corresponding to the difference between the analog input and the reference voltage next below the analog input, and (2) a second residue corresponding to the difference between the analog input and the reference voltage next above the analog signal level. These two residue signals are amplified and directed to the second A/D stage. The sum of the residue signals equals one LSB of the first A/D stage, so that the two residues supply to the second stage information about the quantization error of the previous stage as well as the quantization step size to be used to define full-scale at the second stage. The second A/D stage develops a set of less-significant bits and two more residue signals for the third A/D stage. The second stage further includes a capacitor network arranged to effectively double the operating range of that stage to accommodate error correction.

14 Claims, 17 Drawing Sheets

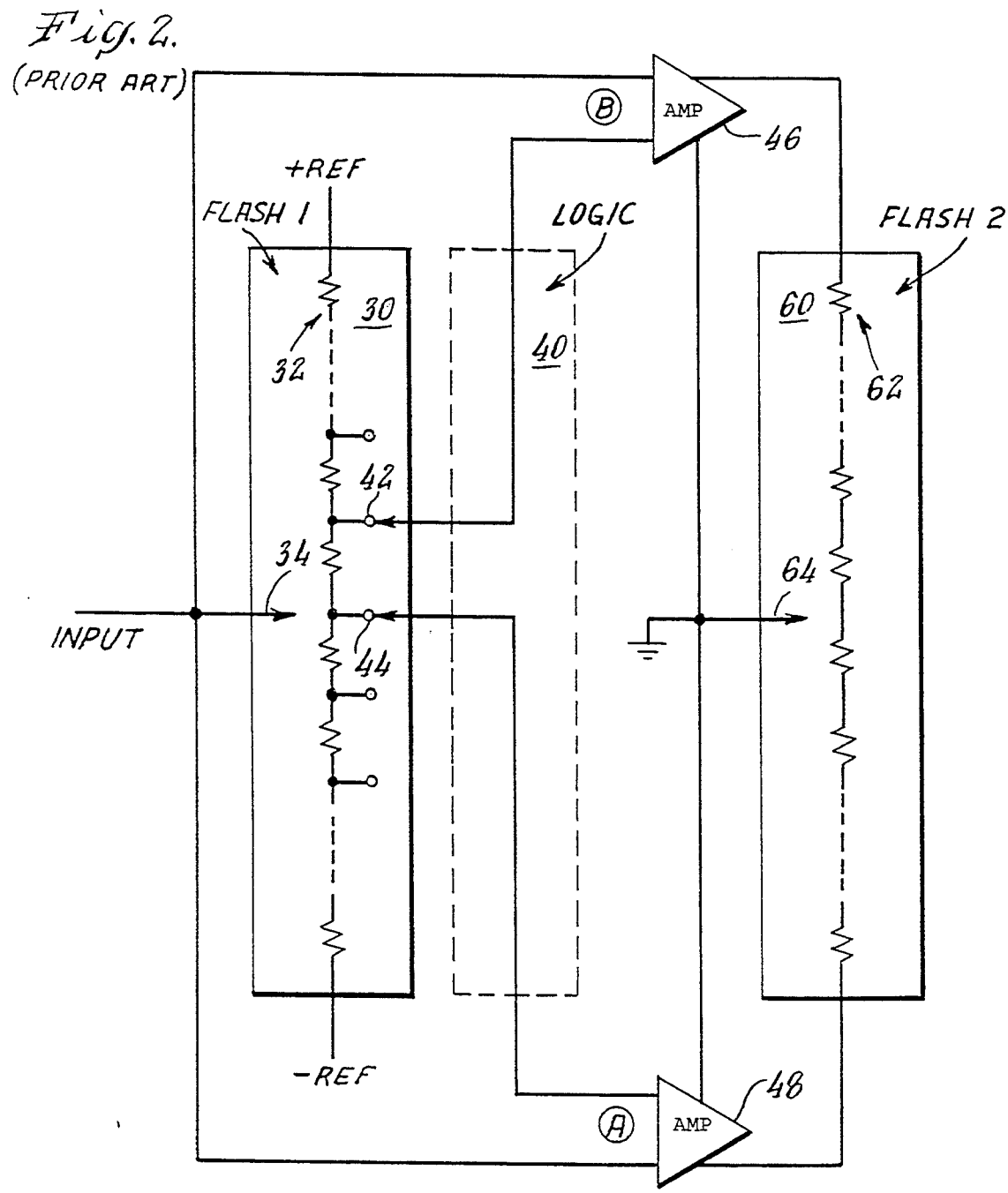

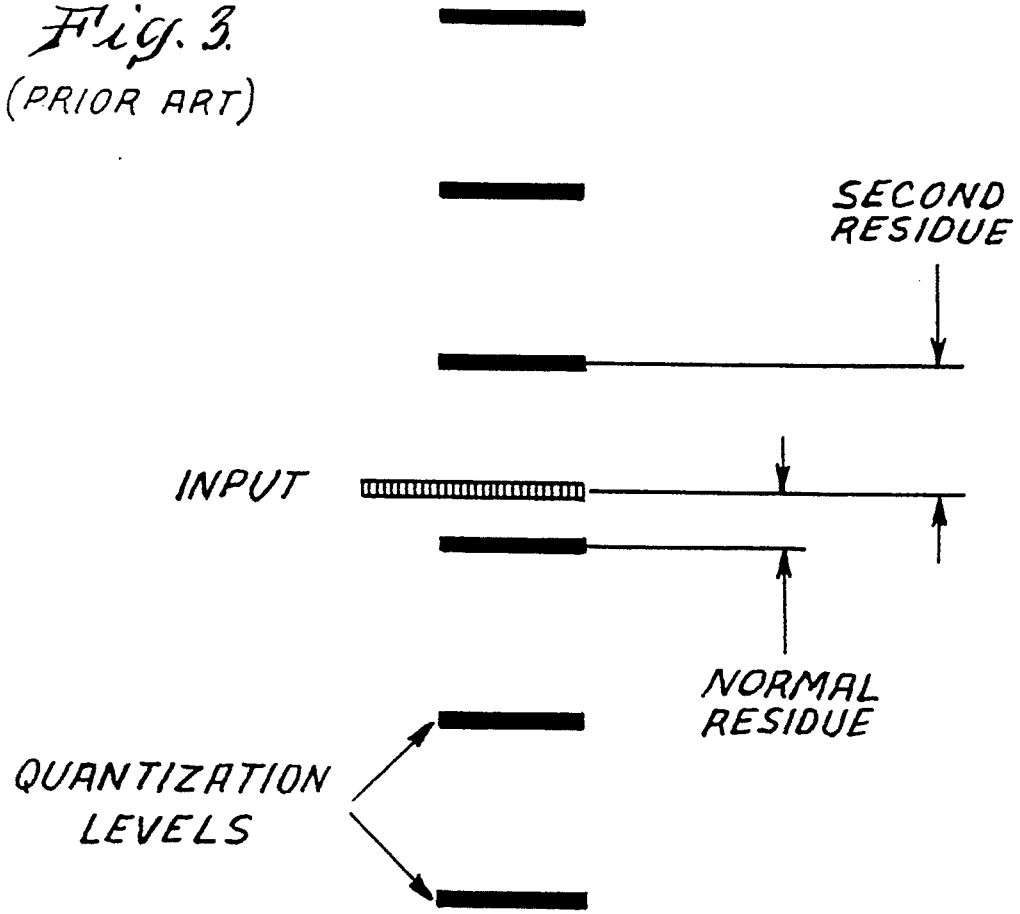

N1 = Residue A True
N3 = Residue B True
N6 = Residue A Complement
N8 = Residue B Complement
N0 = (2·N1 + N8)/3
N2 = (N1 + N3)/2
N4 = (2·N3 + N6)/3
N5 = (N3 + 2·N6)/3
N7 = (N6 + N8)/2
N9 = (N1 + 2·N8)/3

FOUR-INPUT COMPARATOR
FRONT-ENDS 5,387,914

1

CORRECTION RANGE TECHNIQUE FOR MULTI-RANGE A/D CONVERTER

BACKGROUND OF THE INVENTION

1. Field of the Invention

This invention relates to analog-to-digital (A/D) converter systems of the cascaded multi-stage type wherein each stage is a parallel converter, and develops a corresponding part of the final digital output signal. More particularly, this invention relates to such converters wherein one or more stage has extended range to provide for error correction.

2. Brief Description of the Prior Art

Parallel or "flash" converters of various designs have been available for some time, and have speed of conversion as their principal goal. One design approach is to employ a successive series of such stages (or cycles of operation) each arranged to develop a digital output of limited scope, e.g., 3 or 4 bits, and to produce from each stage (or cycle of operation) an analog residue signal representing the difference between the analog input and the quantized approximation made by the previous stage. This residue signal is the input for the next stage (or cycle). An example of this kind of converter is shown in U.S. Pat. No. 4,814,767 (Fernandes et al).

In a later design, shown in U.S. Pat. No. 5,184,130 issued on Feb. 2, 1993 to the present inventor, the first stage of the converter develops two analog residue signals for the second stage. These two residue signals represent the differences between the analog input signal and the two first-stage flash converter thresholds (or "quantization levels") which are respectively above and below the analog input signal. The sum of these two residue signals is equal to one LSB of the first-stage flash converter. Both of these two residue signals are amplified by respective interstage amplifiers. The second flash stage uses the amplified sum of these two residues as its reference signal, thus defining the required full-scale range of the second flash stage.

It is desired to provide such a converter with error correction capability, such as disclosed in the above Fernandes patent, wherein the range of one (or more) stages is extended beyond its nominal range. Such additional range is sometimes referred to as "error correction range", "overlap", or "redundancy". However, in the two-residue architecture, providing such additional range presents a problem, since there is no "reference signal" in the usual sense, and thus error correction cannot be achieved simply by using a larger reference signal. An alternative way of achieving this effect of an increased range is shown in U.S. Pat. No. 5,151,700 (Matsuzawa et al). That scheme however requires developing three signals from the first stage and introduces undue complexity.

SUMMARY OF THE INVENTION

In a preferred embodiment of the invention, to be described below in detail, there is provided a three-stage A/D converter wherein the operating range of the second A/D stage is enlarged by applying the two residue signals from the first stage to a capacitor network arranged to develop nodal voltages for establishing threshold levels for the associated flash converter comparators. These residue signals are differential in format. That is, each residue is represented by a "true" signal and its complement. With such differential signals, the capacitor network can produce threshold voltages lying outside of the nominal range of the A/D stage, which thus is made capable of processing errors in the signals received from the preceding stage.

Other objects, aspects and advantages of the invention will in part be pointed out in, and in part apparent from, the following description of a preferred embodiment of the invention, considered together with the accompanying drawings.

BRIEF DESCRIPTION OF THE DRAWINGS

FIG. 2 is a diagrammatic representation of two stages of a two-residue A/D converter as described in U.S. Pat. No. 5,184,130;

FIG. 3 is a pictorial representation of the two residues of the converter in FIG. 2;

DETAILED DESCRIPTION OF A PREFERRED EMBODIMENT

Figure 1:
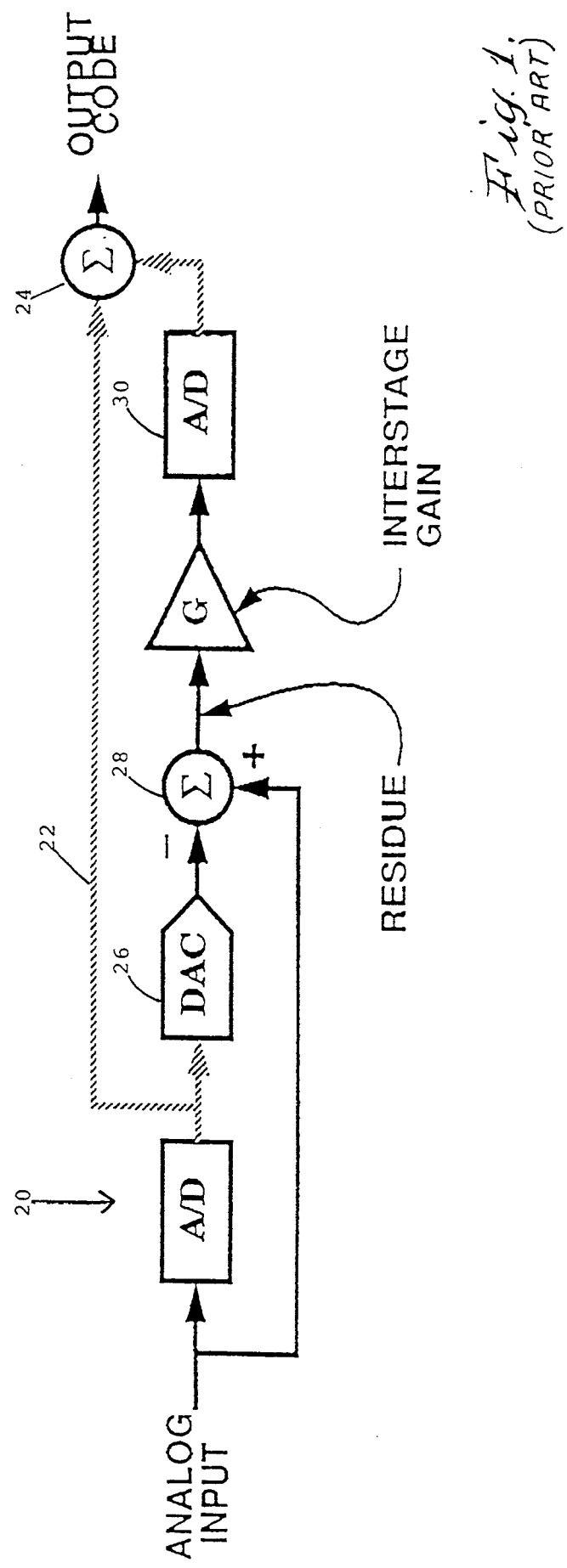
FIG. 1 is a block diagram illustrating elements of a conventional multi-stage A/D converter.

Referring to FIG. 1, there is shown a conventional multi-stage A/D converter including a first A/D converter stage 20 which produces an output comprising a set of most significant bits which are directed along a line 22 to a digital summing device 24. This output also is directed to a D/A converter (DAC) 26, the output of which is applied to an analog summing device 28 together with the analog input signal. This device produces a difference signal (the "residue") which is amplified by an interstage gain element G and directed to a second stage flash A/D converter 30. This converter produces an output in the form of a set of less significant bits which are directed to the digital summing device 24 to produce the complete digital output signal.

FIG. 2 is a conceptual illustration of a "two-residue" converter of the type described in the above U.S. Pat. No. 5,184,130. The first stage flash converter (Flash 1) includes a resistor string activated by a reference voltage and producing a set of threshold voltage levels at its tap points. The input signal is compared with these threshold voltage levels by comparators forming part of Flash 1 (but not shown in FIG. 2). Logic circuitry exemplified by the dashed-line block 46 selects a pair of tap voltages from Flash 1 and directs these voltages to the inputs of respective matched inter-stage amplifiers together with the analog input signal. The outputs of these amplifiers provide the two residue signals which are applied across a resistor string ("flash ladder") forming part of the second flash stage Flash 2. These amplifiers thus serve the same function as the summing device 28 and gain element G of FIG. 1.

Figure 4A:
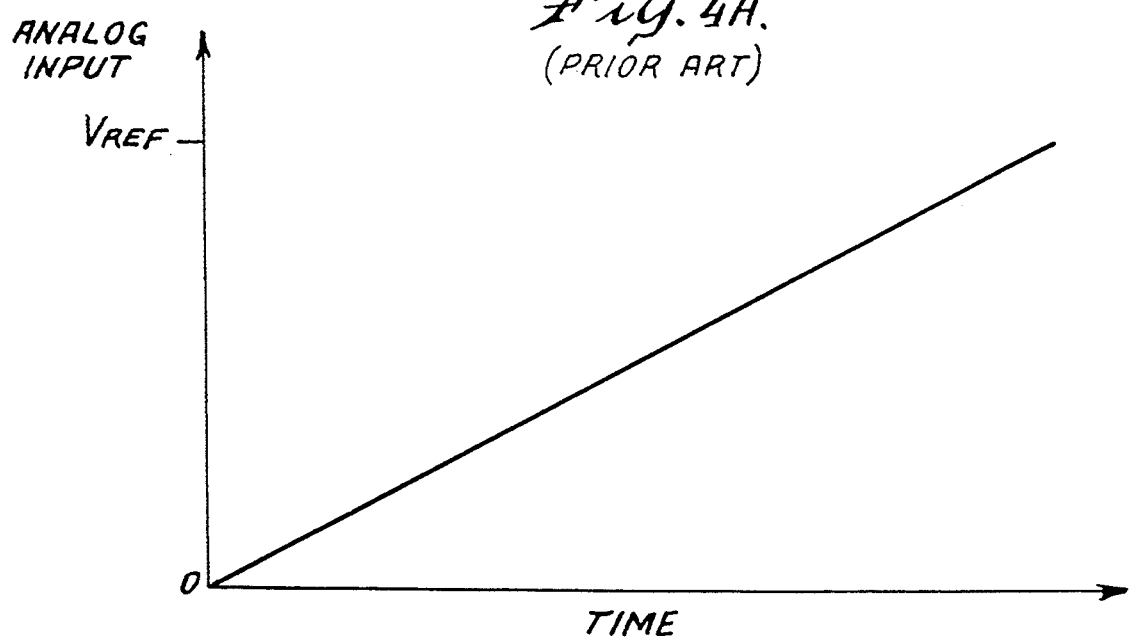
FIGS. 4A, 4B and 4C show graphically the variation in the two residue signals as the analog input is swept linearly with time.
Figure 4B:
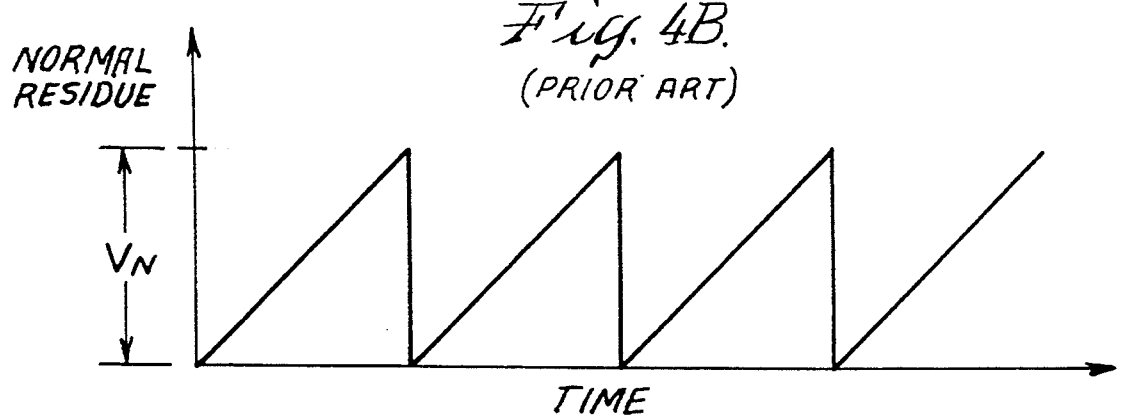
Figure 4C:
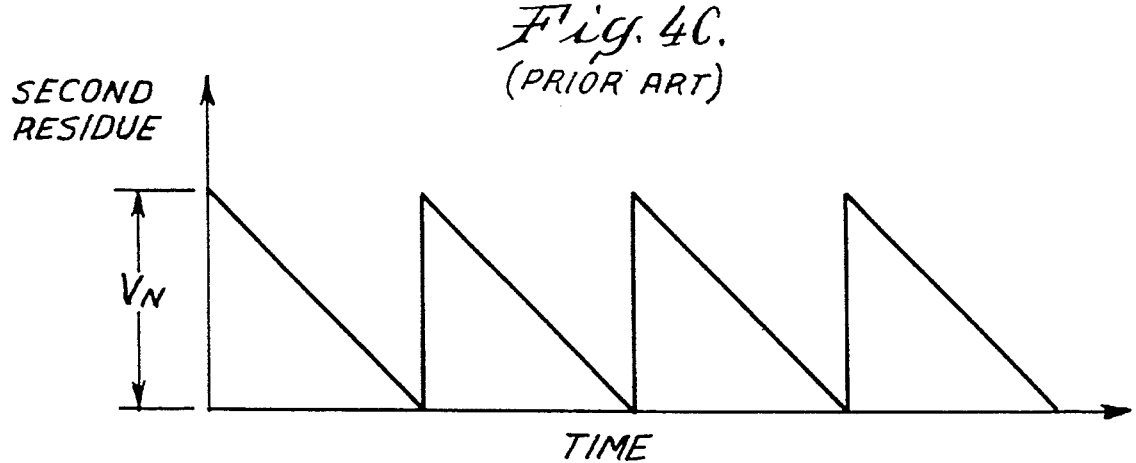
Figure 5:
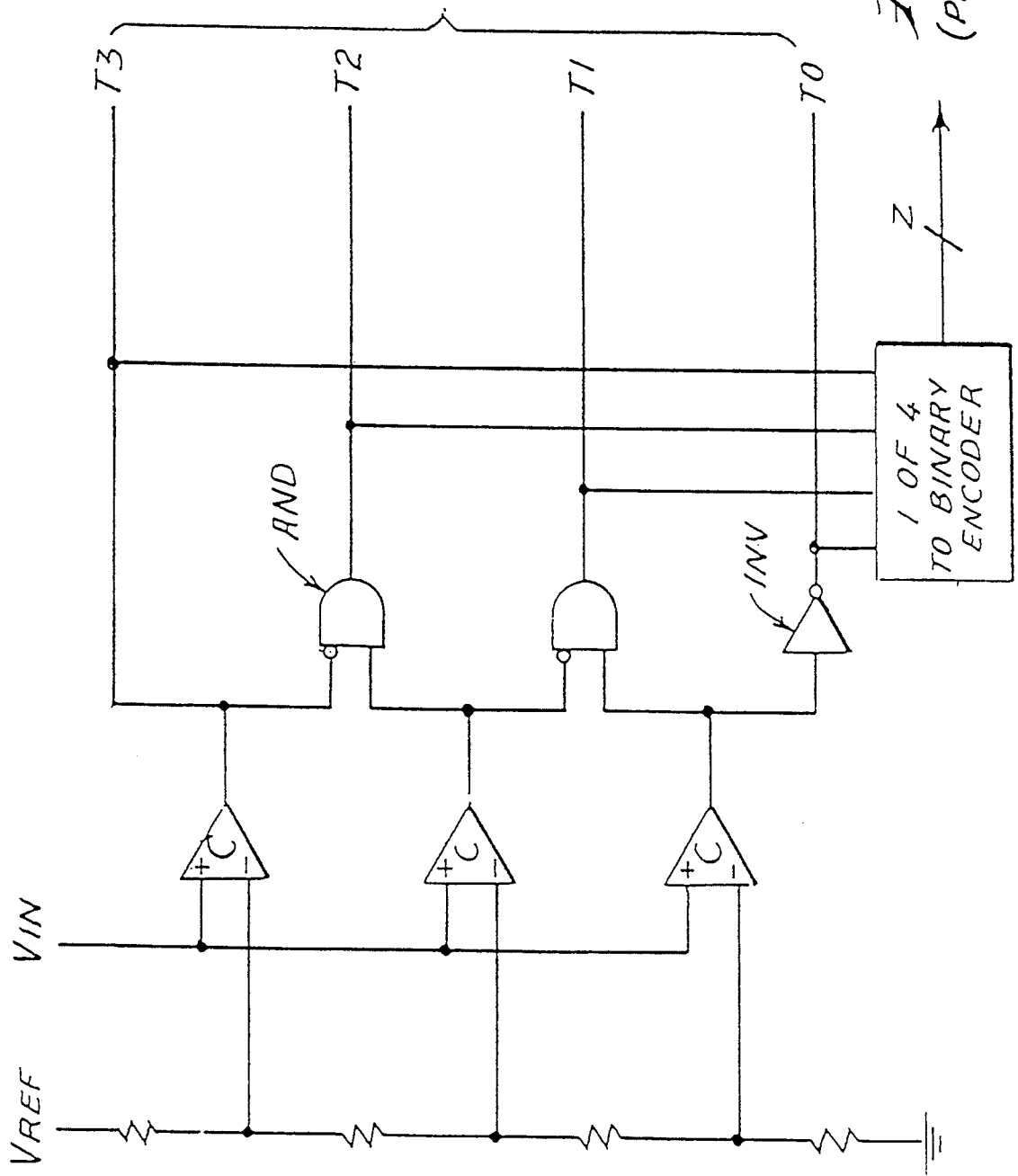
FIG. 5 is a circuit diagram showing logic elements which can be used to decode the output of a flash converter stage of the resistor string type.
Figure 6:
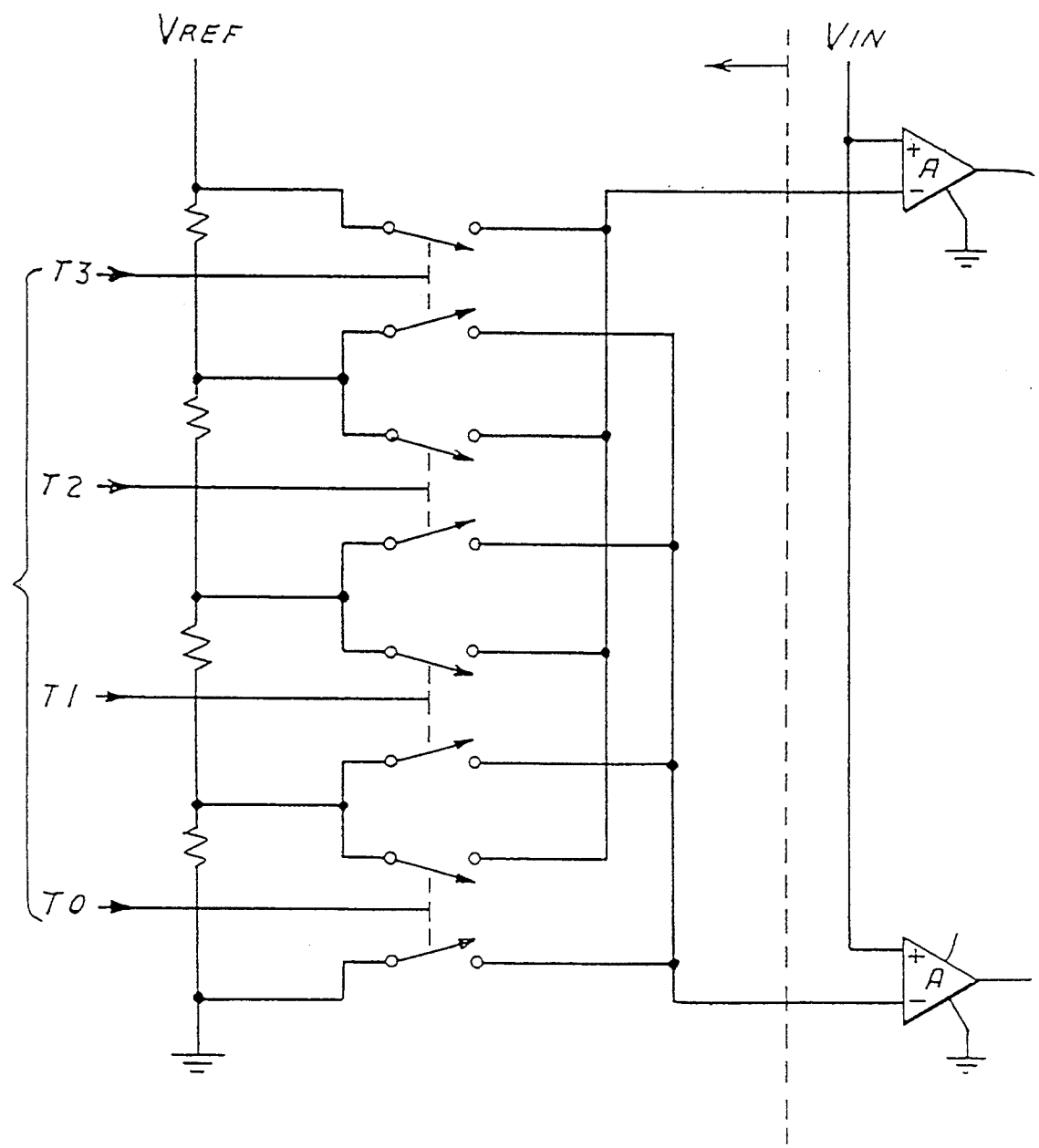
FIG. 6 shows a switching circuit responsive to the decoded signals of FIG. 5 and operable to apply the two residue signals to respective inter-stage amplifiers.

FIG. 3 illustrates the relationship between the analog input signal for the converter of FIG. 2 and the threshold voltage levels developed by the associated resistor string. FIGS. 4A-4C show how the residue signals vary as the input signal is swept from zero to some arbitrary value. FIG. 5 shows a logic circuit for comparing the analog input with the reference voltage levels (at the flash ladder nodes) and producing a corresponding digital signal (1 of 4) which is converted to a binary output signal. FIG. 6 shows switch circuitry responsive to the 1 of 4 signal in FIG. 5 for selecting the correct resistor tap voltages to be directed to the inter-stage amplifiers together with the analog input signal, so as to develop both residue signals at the outputs of the corresponding amplifiers.

Figure 7:
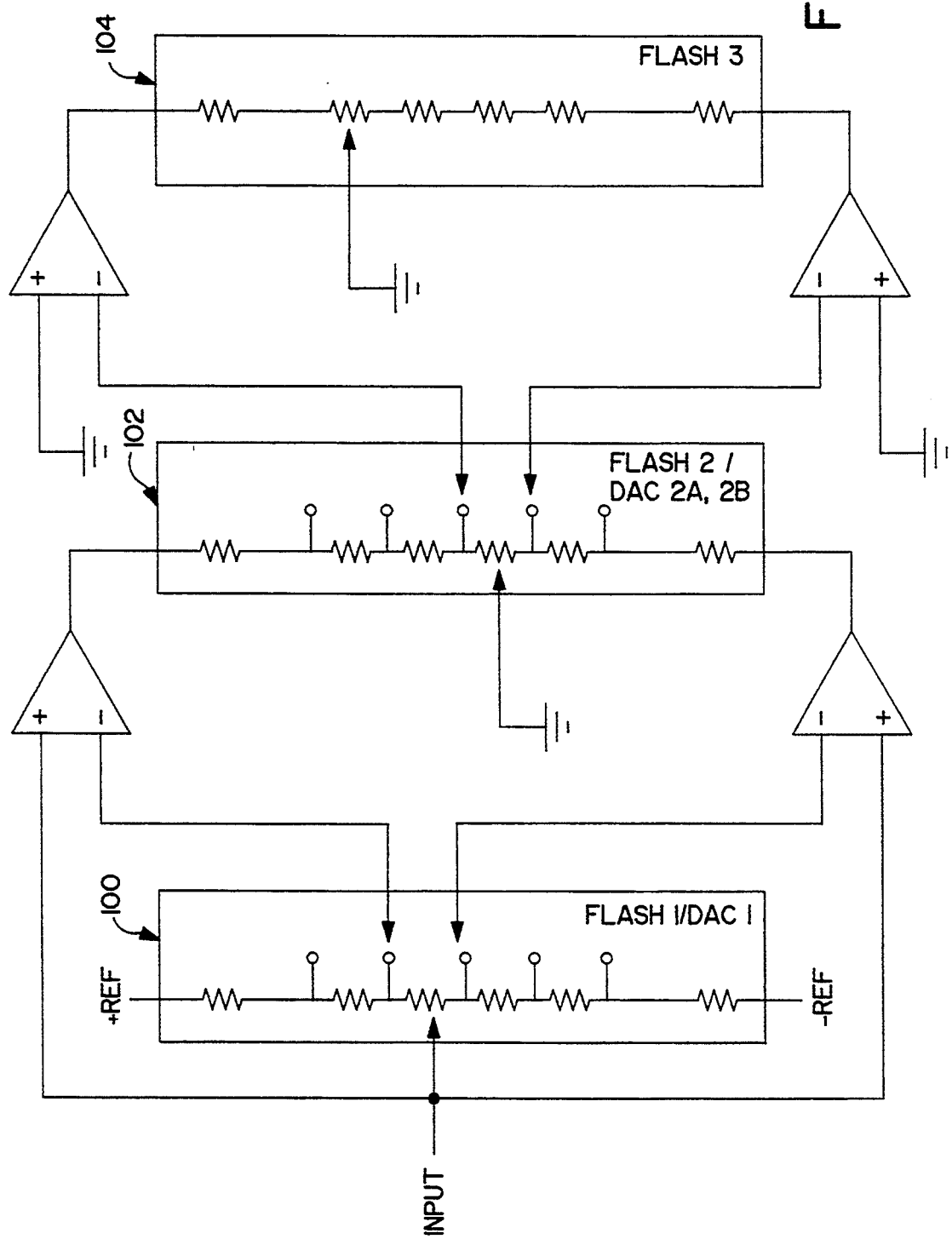
FIG. 7 is a diagram like FIG. 2 but showing three flash stages with inter-stage amplifiers.

Turning now to the present invention, FIG. 7 shows pictorially a converter having three cascaded flash stages 100, 102, 104, e.g., stages which are comparable to the two flash stages of FIG. 1. In this case, the two residue signals from flash 100 are amplified and applied to the resistor string of flash 102, and the two residues of that flash stage are amplified and applied to the resistor string of the third flash 104. In flash stages 102, 104, the input to the flash ladder is ground, and the potentials at the ends of the ladder slide up or down with respect to ground as the analog input signal at flash 100 is varied.

Figure 8:
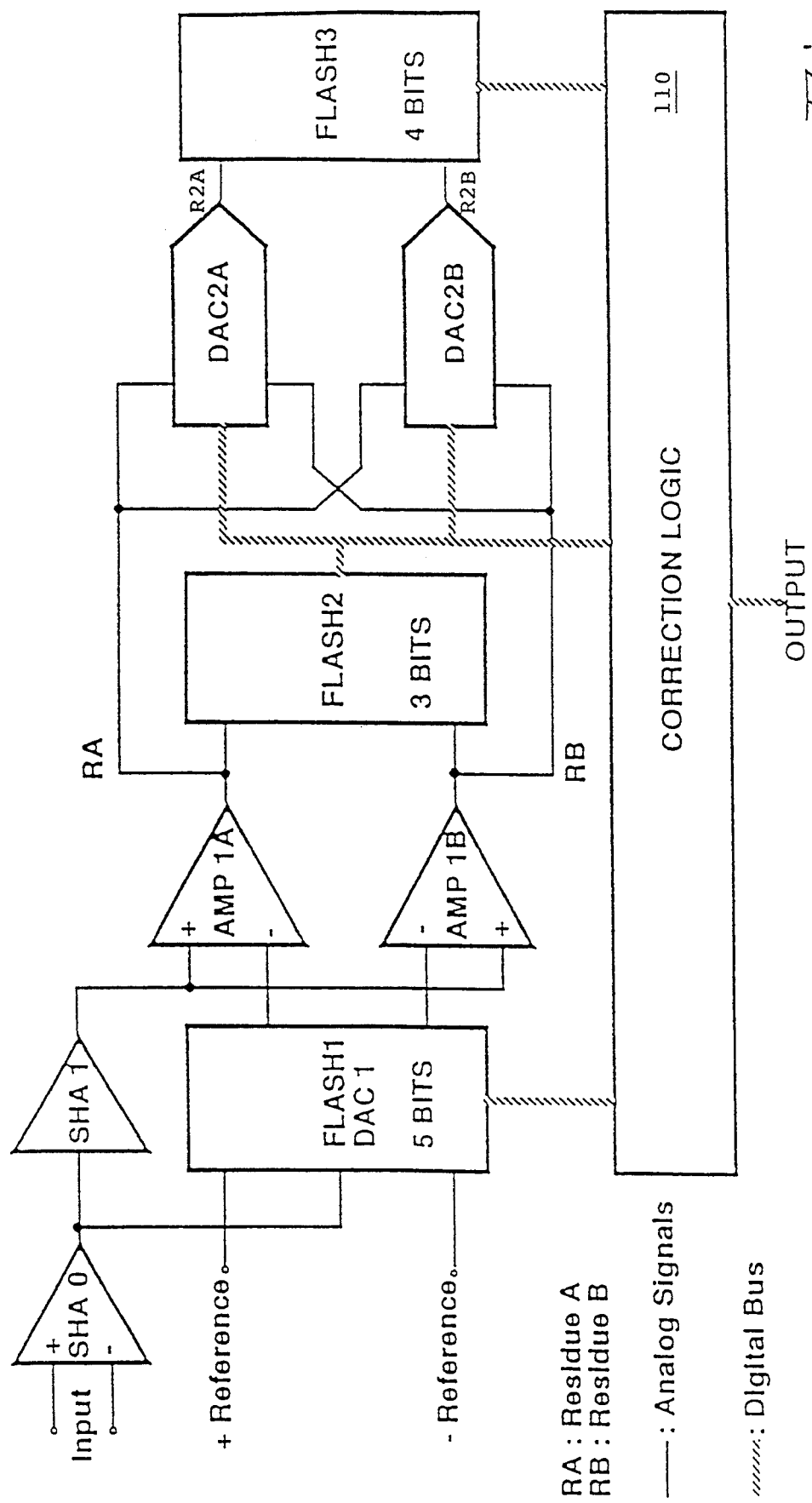
FIG. 8 is a block diagram showing of the converter of FIG. 7.

FIG. 8 presents a detailed block diagram showing the three-stage arrangement of FIG. 7. Here the input signal is fed to a sample/hold (SHAO) which (upon activation by clock pulses, not shown) directs the sampled signal to a second sample/hold (SHA1) and to the first flash stage (Flash 1). This flash produces a set of most significant bits which are directed through a digital bus to the logic circuitry 110. The flash stage (Flash 1) includes a D/A converter "DAC 1" for producing two analog voltage reference level signals which are directed to the amplifiers 1A, 1B.

The output of Flash 1, as explained above, selects the two quantization levels above and below the input signal, and sends these two signals to the inter-stage amplifiers (AMP 1A, 1B) which also receive the output signal from the second sample/hold (SHA1). Thus, these amplifiers create at their output the two residue signals for the second flash stage ("Flash 2") which, functioning as previously described, produces a second set of digital bits, of a lesser order than the set produced by Flash 1, e.g., in a manner described in the above U.S. Pat. No. 5,184,130. These bits are directed to the logic 110, and also are directed to DAC2A and DAC2B respectively. These DACs also receive the residue signals RA, RB from Flash 1, and produce a second pair of residue signals R2A, R2B for Flash 3.

Figure 9:
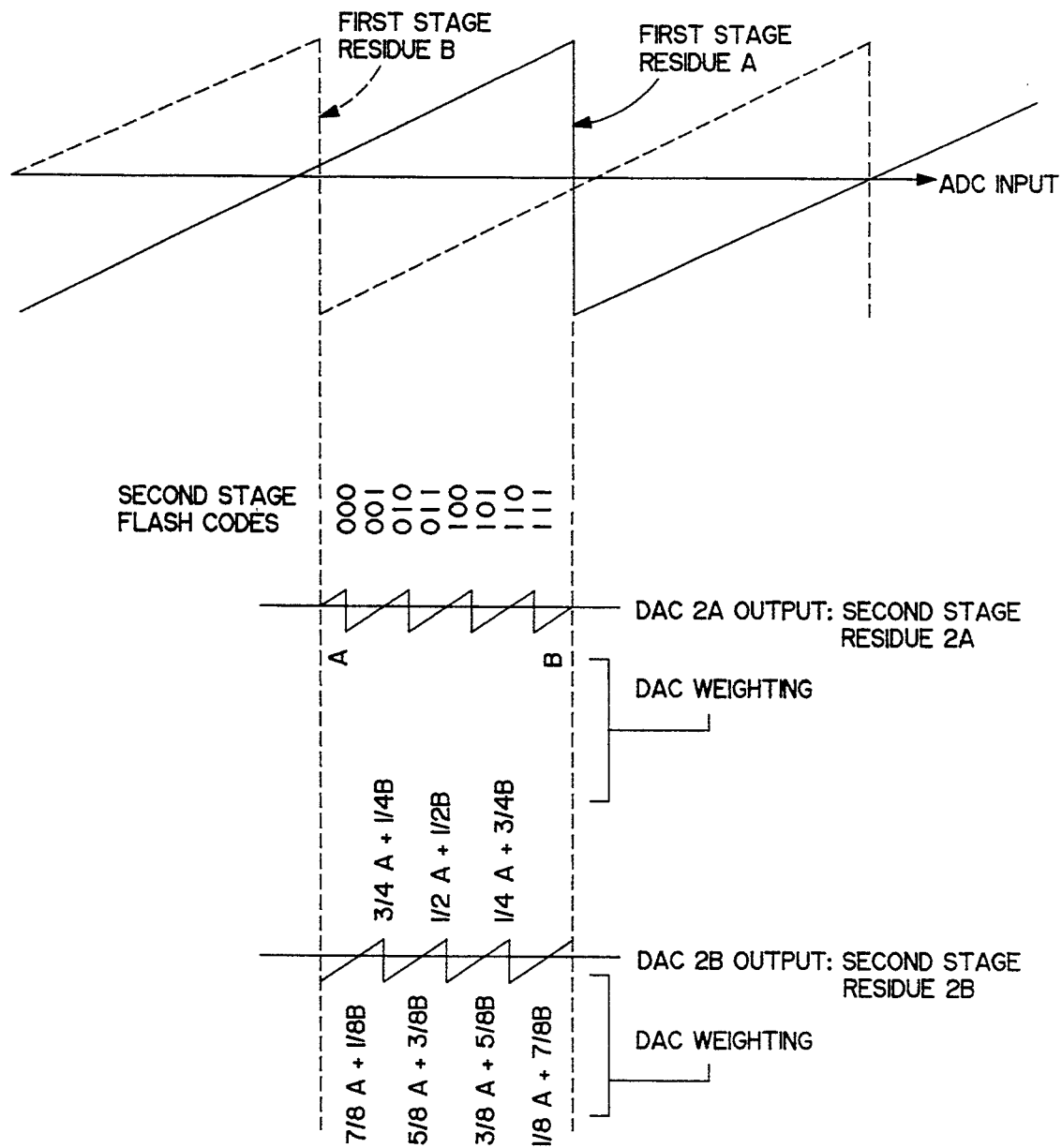
FIG. 9 is a graphical presentation of the two residue signals developed from the second stage of FIG. 8.

These second stage residue signals are graphically presented in FIG. 9, together with the associated digital codes. It will be seen that the residue signals are out of phase, just as are the first stage residue signals. That is, the peak of one residue from one DAC occurs at the input signal level which produces a mid-amplitude residue signal from the other DAC. The required relationship can be achieved by weighting the DAC function as shown in FIG. 9. One DAC arrangement for obtaining such weighting is shown for DAC 2A in FIG. 10, wherein four equal-valued capacitors are connectable from either residue A or B to the input of an operational amplifier with capacitor feedback. The DAC switches are controlled by comparator logic signals developed from the output of Flash 2, as by means of logic circuitry comparable to circuitry illustrated in FIG. 5. DAC 2B could function similarly, but with an offset as shown in the graphics of FIG. 9. Such a DAC may be provided with switched ground connections (as shown) to zeroize the capacitors of the DAC appropriately.

Figure 11:
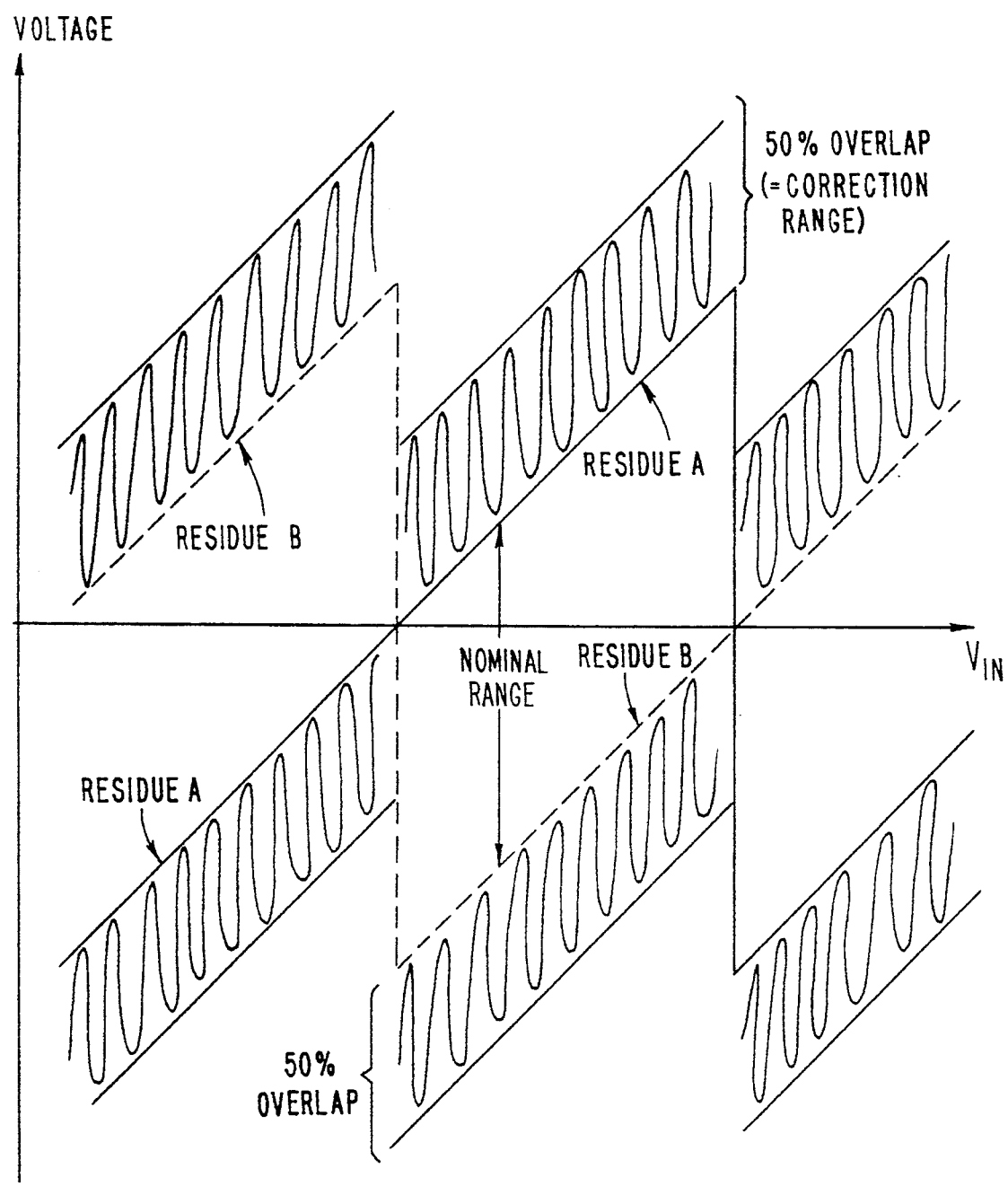
FIG. 11 is a graphical presentation showing increased operating range for accommodating error correction.

The residue signals R2A, R2B (FIG. 9) are directed as inputs to the third flash stage (Flash 3) which produces a corresponding low-order digital signal to be combined with the digital signals from Flash 1 and Flash 2. This third stage can be of any suitable type, for example as described as the second flash stage in the above U.S. Pat. No. 5,184,130.

Where error correction is desired, the operating range of the associated flash stage can be expanded, e.g., to double the normal range, as shown graphically in FIG. 11. There it will be seen that the residue signals are augmented by an additional signal increment which, in this case, adds 50% to each end of the nominal range.

Figure 12:
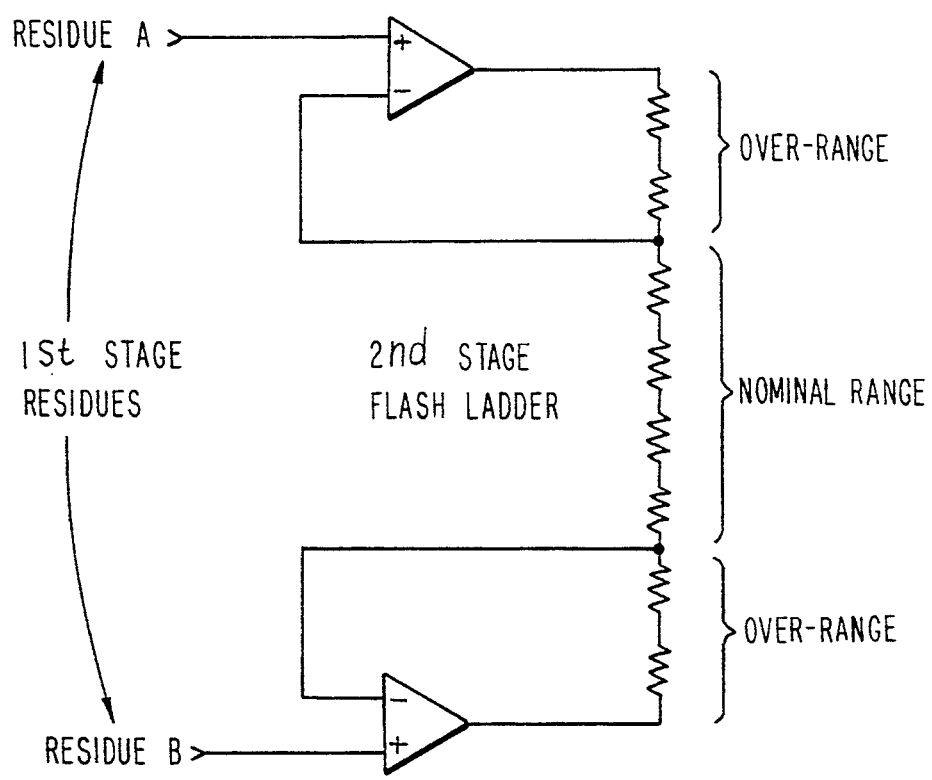
FIG. 12 is a circuit diagram illustrating one type of network which could be used for expanding the operating range for error correction.

Such augmentation could be effected by means of a suitable feedback network such as shown in FIG. 12. This network includes a resistor string (flash ladder) serving to provide threshold voltages at its tap nodes in the nominal (normal) range as shown in FIG. 2, and further includes additional ladder resistors to provide threshold voltages in the desired correction range.

However, a resistive load is not satisfactory for amplifiers based on CMOS technology, and which is preferred to other amplifier technologies for various reasons. Accordingly, the preferred embodiment of this invention employs a capacitor network rather than a resistor network for processing the residue signals, as in a flash ladder as previously described, to produce signals for a bank of comparators.

Figure 13:
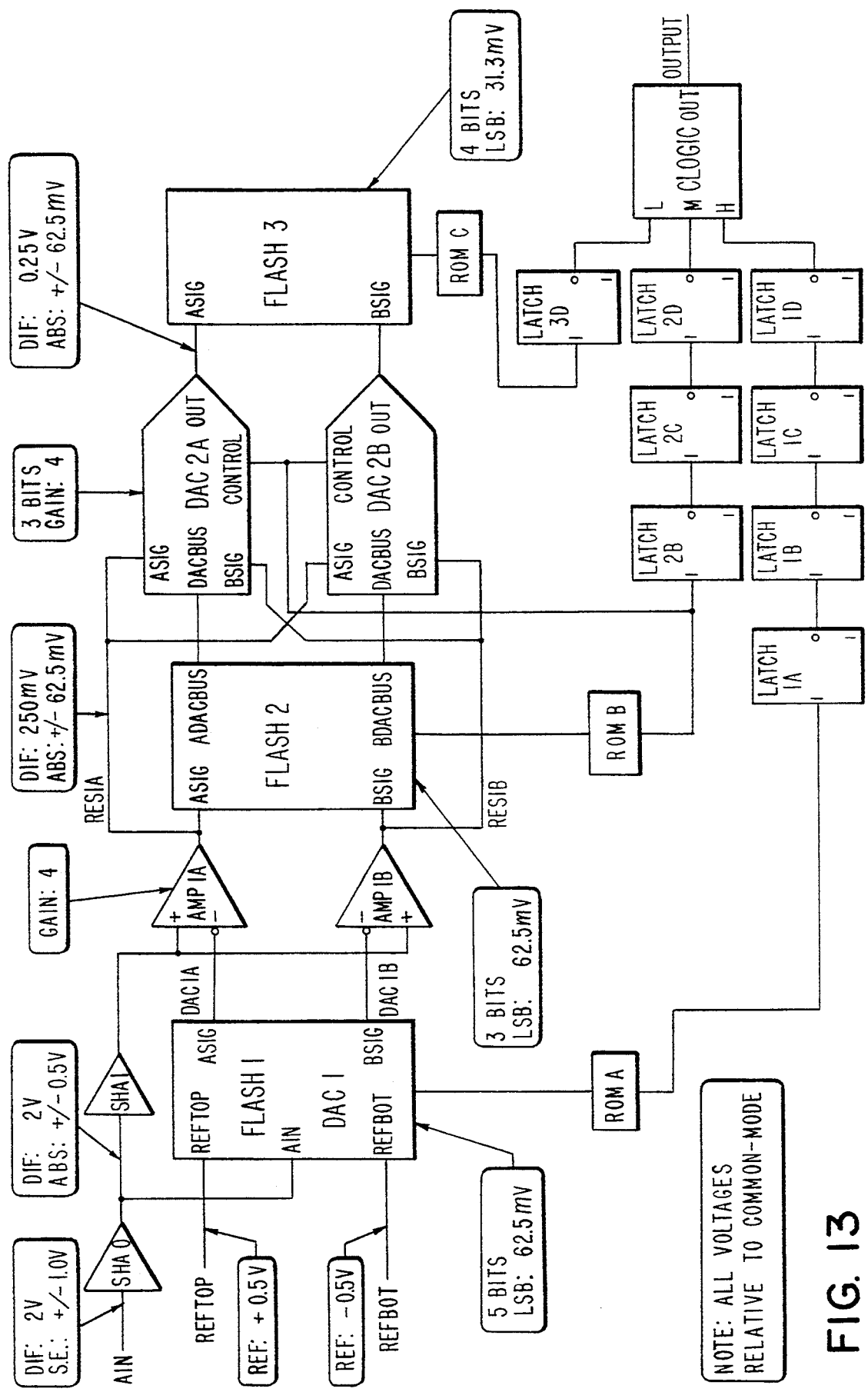
FIG. 13 is a block diagram of a three-stage A/D converter wherein the residue signals are developed as differential signals.

Moreover, in accordance with a further inventive aspect, the signals applied to this capacitor network are differential in format. That is, the residue signals will include a "true" component and a "complementary" component. A block diagram of the three-stage converter, together with selected differential signal notations, is presented in FIG. 13. This figure also shows the use of read-only-memories (ROMA, etc.) for decoding the digital signals from the respective flash stages, together with means for combining the stage output signals to produce the composite output signal.

Figure 14:
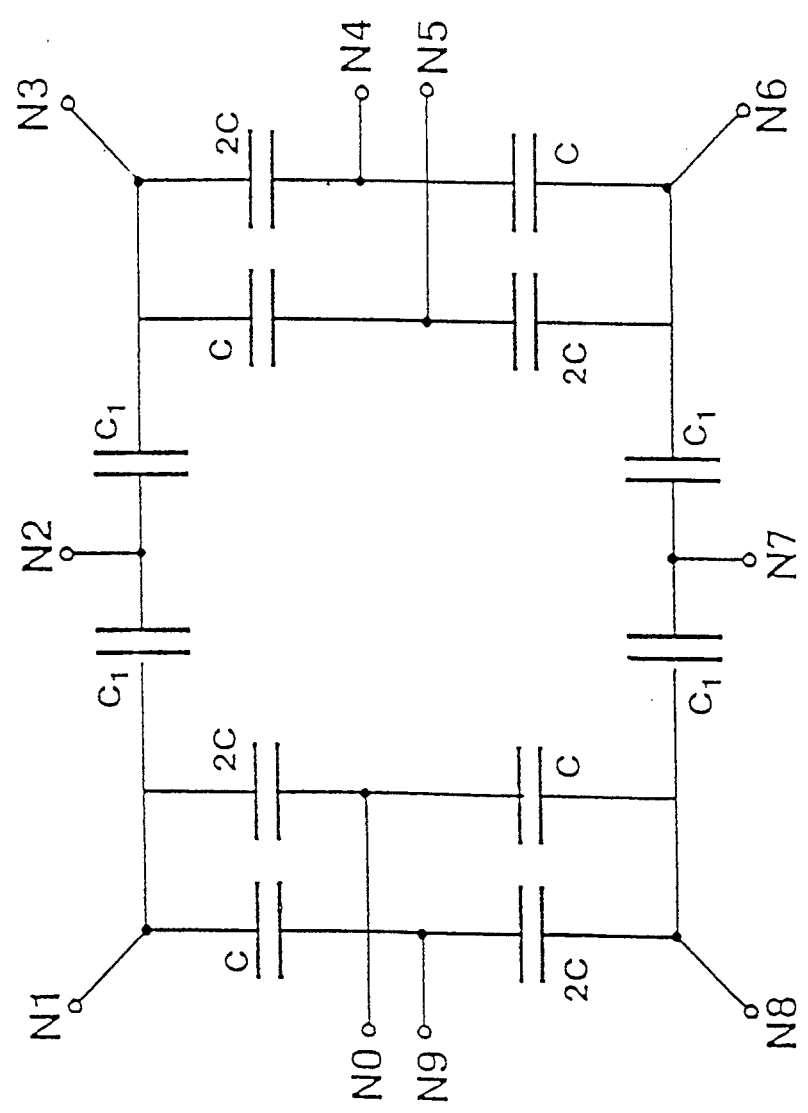
FIG. 14 shows a capacitor network useful for expanding the operating range of an A/D converter of the differential-signal type.
Figure 15:
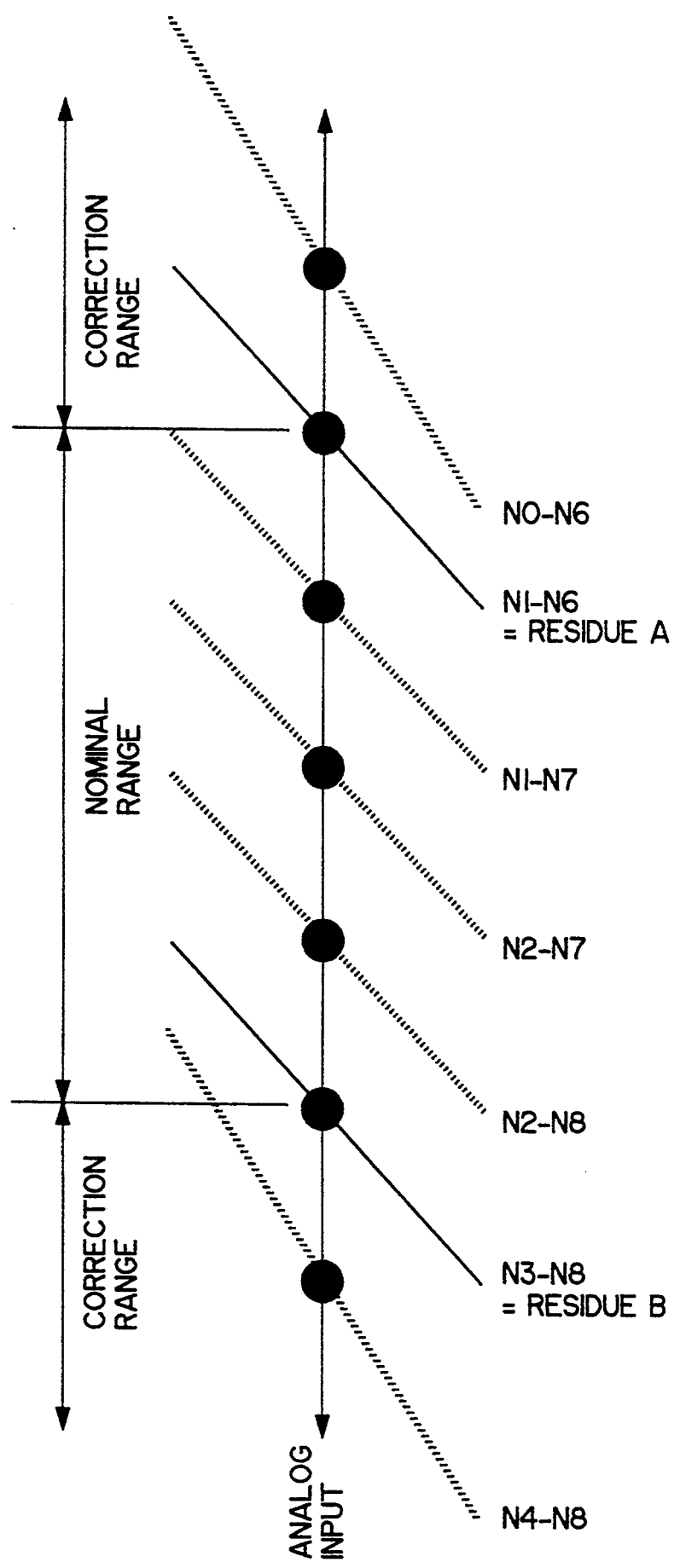
FIG. 15 is a graphical presentation of the variation in threshold levels produced by the network of FIG. 14, while increasing the analog input voltage linearly.

The capacitor network for developing threshold voltage signals for corresponding comparators in the second stage is shown in FIG. 14. This figure also includes notations showing the interconnections for the differential input and output signals. FIG. 15 is a graphical presentation of the comparator input signal swings as the analog input signal is varied though its full range. It will be seen that the threshold output voltages at each end extend beyond the nominal operating range to accommodate error correction. Providing this extended operational range is one principal object of the present invention.

Common mode problems can occur when employing two residue signals as described. To avoid such problems, the differential output signals from the FIG. 15 network nodal points are connected to respective 4-input comparators, shown in FIG. 16, and which serve the same basic logic functions described above and as carried out by two-input comparators previously described (see U.S. Pat. No. 5,184,130).

Figure 16:
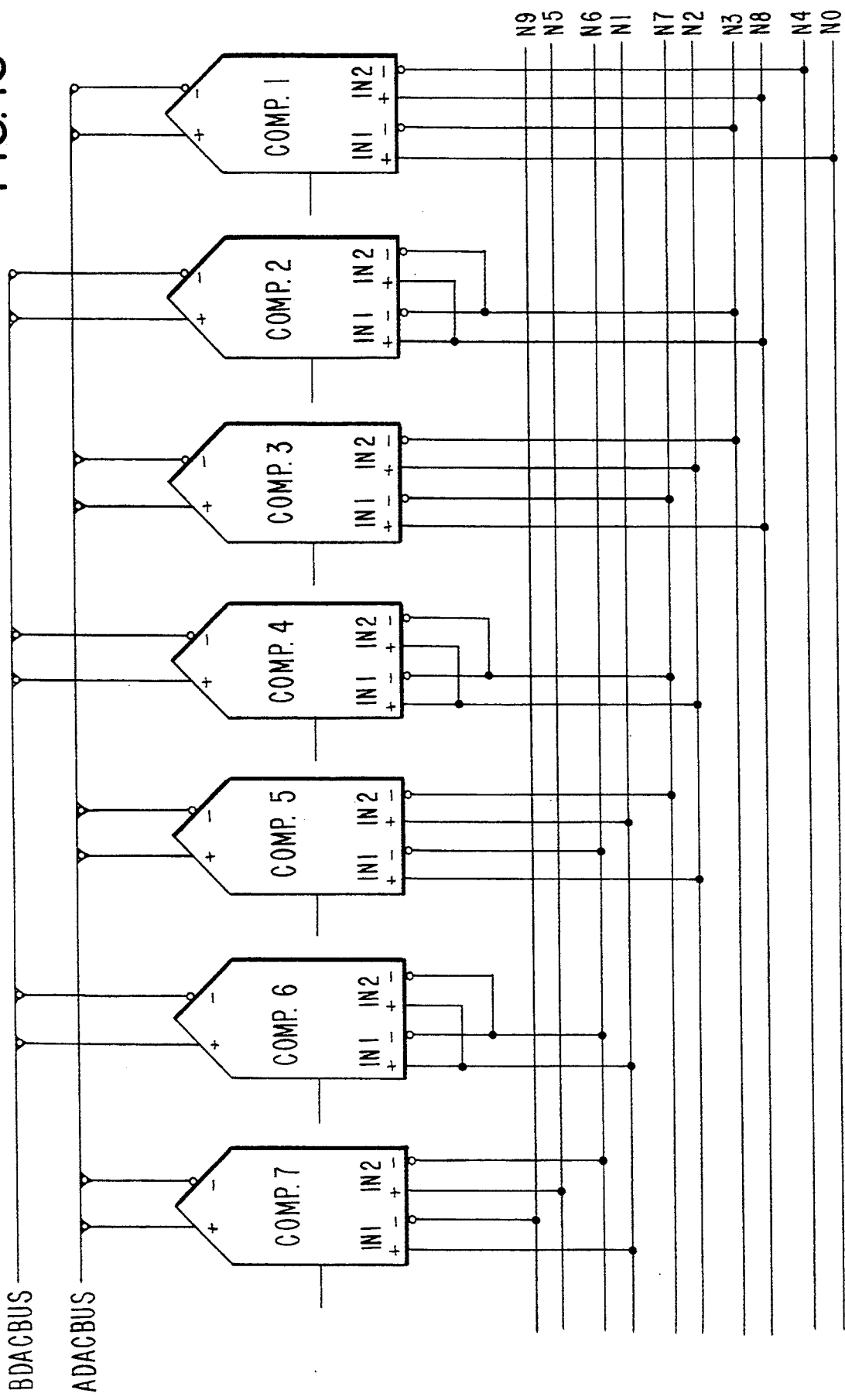
FIG. 16 shows a set of 4-input comparators to be used for decoding the output signals of the network of FIG. 15.
Figure 17A:
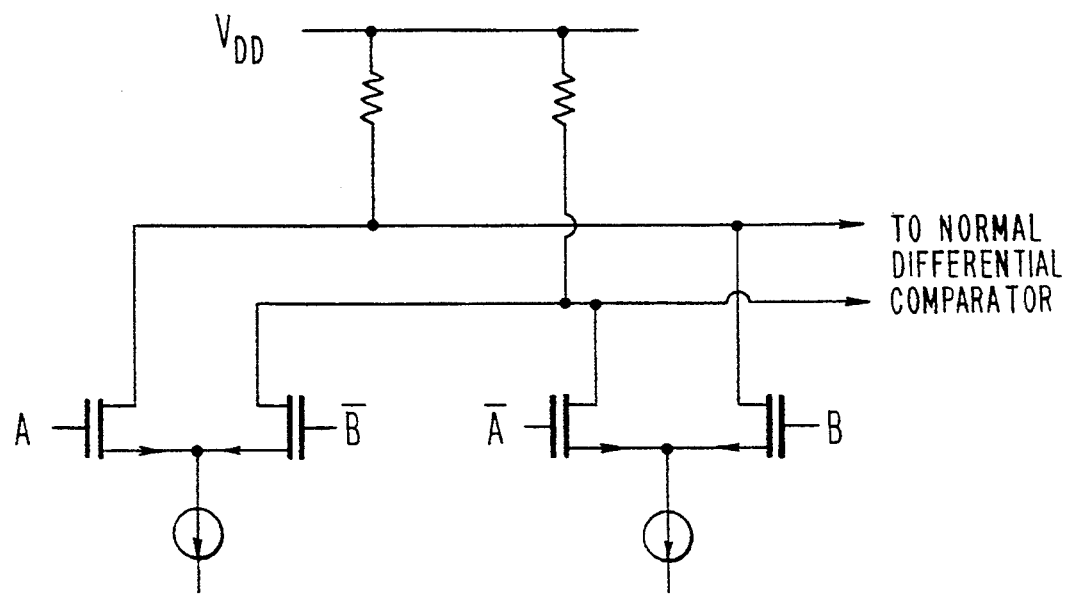
FIGS. 17A and 17B illustrate analog pre-processing circuitry to serve as a 4-input front end for a normal 2-input comparator.
Figure 17B:
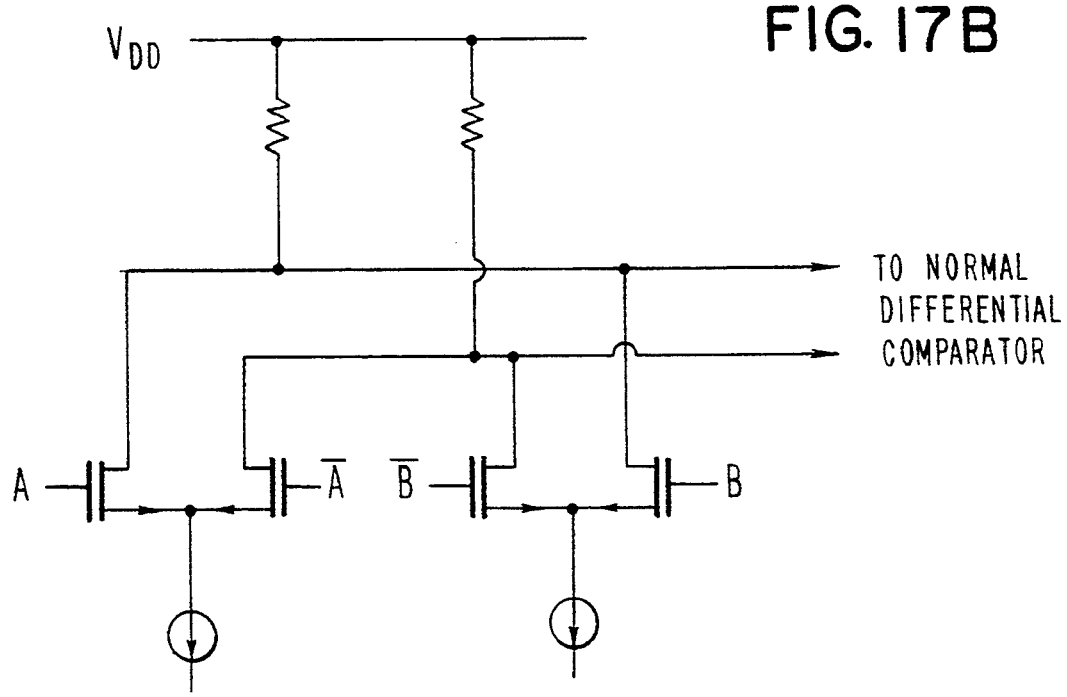

The comparator connections to the capacitor network nodal points are represented by letter indications on FIG. 16, keyed to the FIG. 15 listing. Such 4-input comparators can be developed as shown in FIGS. 17A or 17B. These circuits show how the residues (e.g. A true and B complement) drive a pre-processing analog stage to produce a 2-wire output for a normal differential comparator as previously described.

Figure 10:
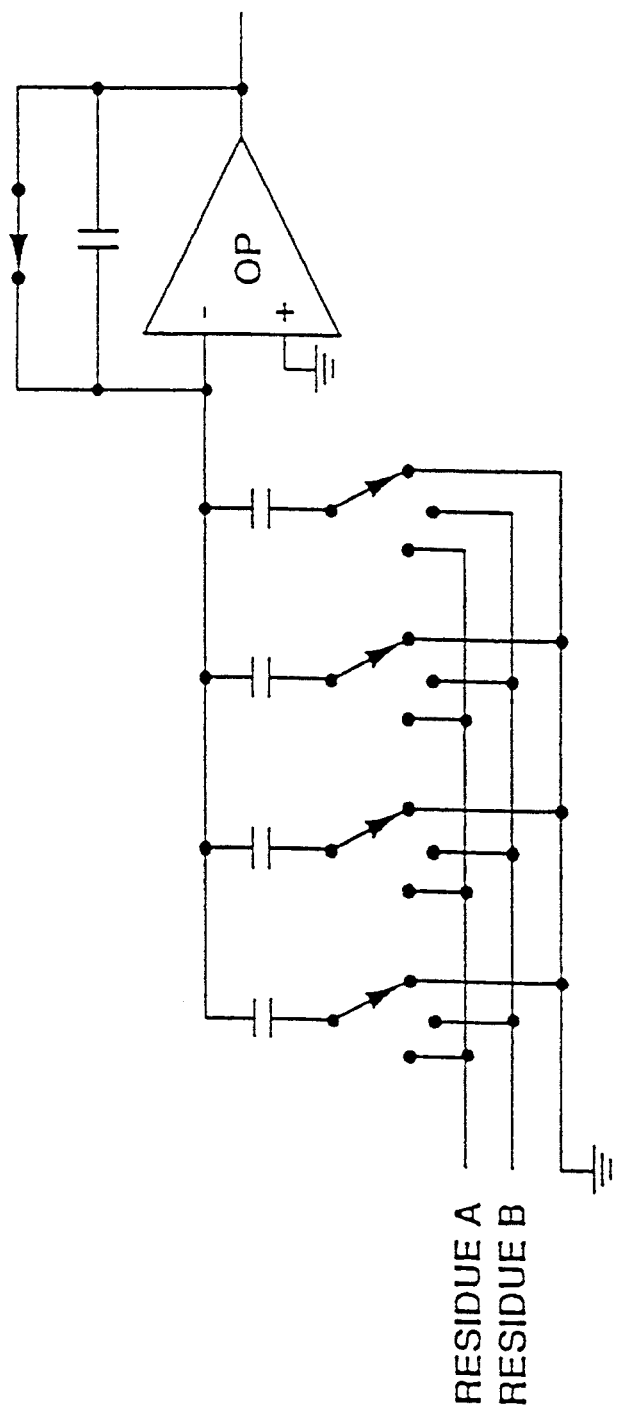
FIG. 10 illustrates a DAC arrangement of a type suitable for use in the second stage of the FIG. 8 converter.

These comparators are used to operate the input switches of the capacitor DAC shown for simplicity in its single-added form in FIG. 10, with each switch being operated between residue A and B by a comparator assigned thereto. The comparators are effectively controlled by a thermometer-type signal, such that as the analog input signal sweeps through its range, the capacitors will progressively be switched from residue A to residue B. This produces the DAC weighting sequence shown in FIG. 9, where initially the switches are all connected to residue A (which is passed directly through to the next stage), and then one switch is connected to residue B giving ¾A and ¼B, and so on.

The A/D converter system is timed by clock pulses by means (not shown), of conventional configuration. This clocking effects a pipeline operation, advancing the signals progressively from stage to stage.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. In a multi-stage A/D converter of the type where at least one stage comprises a flash converter producing two residue signals for the following stage; that improvement for providing error correction capability by expanding the operating range of said following stage, comprising:
   a first flash stage having output means to produce said two residue signals which together represent a least significant bit (LSB) of said first flash stage;
   a second flash stage having an input receiving said residue signals;
   said second flash stage having a nominal operating range for processing normal error-free input signals;
   said second stage comprising a network responsive to said two residue signals and operable to produce corresponding threshold signals for a set of comparators to produce logic signals representing digitally the magnitude of the input signal defined by said two residue signals;
   said network comprising means to produce threshold signals outside of said nominal range of said second stage.

2. An A/D converter as in claim 1, wherein said network comprises a plurality of interconnected impedance elements.

3. An A/D converter as in claim 2, wherein the impedance elements are capacitors.

4. An A/D converter as in claim 1, wherein said residue signals are differential in format.

5. An A/D converter as in claim 4, wherein the threshold signals from said network are differential in format.

6. An A/D converter as in claim 5, wherein at least some of said comparators have four input terminals to receive two differential signals.

7. An A/D converter as in claim 1, wherein said network comprises a plurality of resistors.

8. An A/D converter as in claim 7, wherein said network resistors are connected in series as a string;
   said network further includes additional resistors at the ends of said string of resistors for establishing a correction range; and
   first and second amplifiers responsive to said residue signals and having their outputs connected to said additional resistors in a negative feedback circuit arrangement.

9. A multi-stage A/D converter comprising at least three successive stages;
   each of said stages including a flash converter for producing a digital flash signal responsive to the analog signal input;
   at least the first and second of said flash stages including means to develop two residue signals responsive to the relative magnitude of the analog signal and the two quantization signal levels above and below the analog signal;
   said two residue signals together defining one LSB of that stage; and
   means associated with each of said flash stages for producing respective digital signals to be combined to produce a final composite output signal.

10. An A/D converter as in claim 9, including two inter-stage amplifiers between said successive stages to intensify said residue signals prior to application to the next stage.

11. An A/D converter as in claim 9, wherein at least one of said stages following the first stage has a nominal operating range suitable in magnitude for processing error-free signals from the preceding stage; and
   means forming part of said at least one stage for expanding operating range thereof so as to accommodate error correction.

12. An A/D converter as in claim 11, wherein said expanding means comprises a network responsive to the two residue signals from the preceding stage and producing respective nodal voltages defining threshold levels for a bank of comparators associated with the flash stage.

13. An A/D converter as in claim 12, wherein said network includes a plurality of impedance elements.

14. An A/D converter as in claim 13, wherein said impedance elements are capacitors.

* * * * *